(12) United States Patent
Baker

(10) Patent No.: US 7,457,170 B2
(45) Date of Patent: Nov. 25, 2008

(54) MEMORY DEVICE THAT PROVIDES TEST RESULTS TO MULTIPLE OUTPUT PADS

(75) Inventor: Ronald Baker, Raleigh, NC (US)

(73) Assignee: Infineon Technologies AG, Munich (DE)

( * ) Notice: Subject to any disclaimer, the term of this patent is extended or adjusted under 35 U.S.C. 154(b) by 44 days.

(21) Appl. No.: 11/273,058

(22) Filed: Nov. 14, 2005

(65) Prior Publication Data

US 2007/0109887 A1    May 17, 2007

(51) Int. Cl.
*G11C 7/00* (2006.01)
(52) U.S. Cl. .................. 365/189.03; 365/201
(58) Field of Classification Search ............ 365/189.03, 365/201

See application file for complete search history.

(56) References Cited

U.S. PATENT DOCUMENTS

| | | | |
|---|---|---|---|
| 5,935,263 A | 8/1999 | Keeth et al. | |
| 6,009,026 A | 12/1999 | Tamlyn et al. | |
| 6,032,274 A | 2/2000 | Manning | |
| 6,055,654 A | 4/2000 | Martin | |
| 6,389,563 B1 | 5/2002 | Oh et al. | |
| 6,418,072 B2 * | 7/2002 | Nakaya et al. | 365/201 |
| 6,484,289 B1 * | 11/2002 | Hsu | 714/820 |
| 6,543,015 B1 * | 4/2003 | Wang et al. | 714/718 |
| 6,819,611 B2 | 11/2004 | Keeth | |
| 6,885,212 B2 * | 4/2005 | Yamamoto et al. | 324/765 |
| 7,114,110 B2 * | 9/2006 | Kikuchi et al. | 714/736 |
| 7,126,865 B2 * | 10/2006 | Hong et al. | 365/201 |
| 2003/0210269 A1 * | 11/2003 | Kikuchi et al. | 324/765 |
| 2005/0156589 A1 * | 7/2005 | Yamamoto et al. | 324/158.1 |

* cited by examiner

*Primary Examiner*—Michael T Tran
(74) *Attorney, Agent, or Firm*—Dicke, Billig & Czaja, PLLC

(57) ABSTRACT

A memory device including at least two output pads and at least two memory die. Each of the at least two memory die is configured to provide an output signal that includes compressed test results to any of the at least two output pads.

25 Claims, 3 Drawing Sheets

MEMORY DEVICE THAT PROVIDES TEST RESULTS TO MULTIPLE OUTPUT PADS

BACKGROUND

Typically, a computer system includes a number of integrated circuit devices that communicate with one another to perform system applications. Often, the computer system includes a controller, such as a micro-processor, and one or more memory devices, such as random access memory (RAM) devices. The RAM can be any suitable type of RAM, such as dynamic RAM (DRAM), double data rate synchronous DRAM (DDR-SDRAM), graphics DDR-SDRAM (GDDR-SDRAM), reduced latency DRAM (RLDRAM), pseudo static RAM (PSRAM), and low power DDR-SDRAM (LPDDR-SDRAM). PSRAM provides advantages in density and speed over traditional static RAM (SRAM).

Integrated circuit device speeds continue to increase and the amount of data communicated between devices continues to increase to meet the demands of system applications. As data volume increases, the industry continues to develop larger memory sizes to accommodate increased data requirements. These trends, of increasing data volume and larger memory sizes, are expected to continue into the future.

Some computer systems include mobile applications and have limited space resources. In mobile applications, such as cellular telephones and personal digital assistants (PDAs), memory cell density and memory device size are issues for future generations. To address these issues, the industry continues to develop higher density memory devices. In one type of memory device, referred to as a stacked component memory device, multiple memory die are packaged in a single package to achieve dramatic space reductions over standard packages and unprecedented memory density per board area. Typically, in these memory devices the memory die share most package pins in parallel, but include separate chip select pins for individually selecting each die.

During testing of stacked component memory devices, compression test mode and other design for test features can be used to compress all outputs of an individual memory die to one output pin. If input/output (I/O) pins from multiple die are connected together, the die cannot be tested in parallel since the tester comparator or judgment circuit cannot determine the outputs of an individual die.

Typically, an individual memory die is selected via its chip select pin and the other memory die in the package are deselected to disable the outputs of all memory die except the memory die under test. The target memory die is tested and the other memory die are sequentially tested using the same method. The total test time is the test time of one memory die times the number of memory die in the package. All the while there is increased pressure to lower the cost of testing and per unit cost. These challenges require test systems and methods that offer greater parallelism and configuration flexibility.

For these and other reasons there is a need for the present invention.

SUMMARY

One aspect of the present invention provides a memory device including at least two output pads and at least two memory die. Each of the at least two memory die is configured to provide an output signal that includes compressed test results to any of the at least two output pads.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
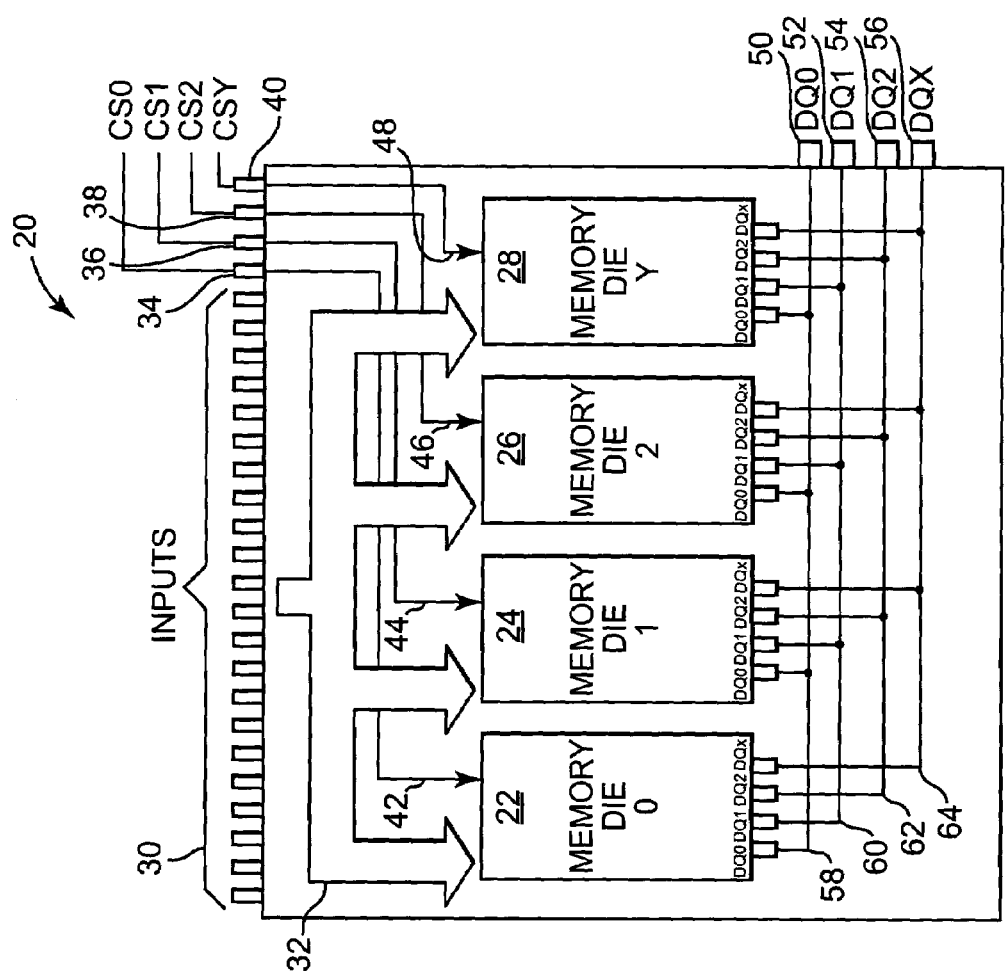
FIG. 1 is a diagram illustrating one embodiment of a stacked component memory device according to the present invention.

FIG. 1 is a diagram illustrating one embodiment of a stacked component memory device 20 according to the present invention. Memory device 20 includes multiple memory die in a single package, including memory die 0 at 22, memory die 1 at 24, memory die 2 at 26, and other memory die, up to memory die Y at 28. In one embodiment, memory device 20 includes four memory die. In other embodiments, memory device 20 includes any suitable number of memory die, such as two or more memory die.

Each of the memory die 22, 24, 26, and up to 28 provides a test result output signal that includes compressed test results. Also, each of the memory die 22, 24, 26, and up to 28 either defaults or is programmed to provide the output signal to one of the output pads of memory device 20, such that no two memory die provide the output signal to the same output pad. During device testing of memory device 20, all memory die 22, 24, 26, and up to 28 are selected at substantially the same time to be tested in parallel and provide the test result output signals at substantially the same time. Thus, total test time is reduced from the test time of one memory die times the number of memory die in the package to the test time of one memory die.

Each of the memory die 22, 24, 26, and up to 28 is a DRAM, such as a DDR-SDRAM, GDDR-SDRAM, RLDRAM, PSRAM, LPDDR-SDRAM, or other suitable DRAM. Also, each of the memory die 22, 24, 26, and up to 28 is the same type of DRAM as the other memory die in memory device 20. In other embodiments, memory device 20 can include different types of DRAM in the same package. In other embodiments, memory device 20 can include different types of memory die, such as SRAM, DRAM and/or EEPROM FLASH memory die, in the same package. Also, in other embodiments, memory device 20 can include any suitable type of memory die and/or any suitable type of die, such as controller die or application specific integrated circuit (ASIC) die. In each embodiment, aspects of the present invention can be included in any and/or all of the die types and die in memory device 20.

Memory device 20 includes input pads 30 that receive input signals INPUTS. The input signals include command signals, address signals, clock signals, and other signals, such as strobe signals, which are used for operation of memory die 22, 24, 26, and up to 28. Each of the memory die 22, 24, 26, and up to 28 is electrically coupled to the input pads via input communications path 32 to receive the input signals INPUTS.

Memory device 20 also includes chip select pad 34 that receives chip select signal CS0, chip select pad 36 that receives chip select signal CS1, chip select pad 38 that receives chip select signal CS2, and so on, up to chip select pad 40 that receives chip select signal CSY. Chip select pad 34 is electrically coupled to memory die 0 at 22 via chip select path 42 that receives chip select signal CS0. Chip select pad 36 is electrically coupled to memory die 1 at 24 via chip select path 44 that receives chip select signal CS1. Chip select pad 38 is electrically coupled to memory die 2 at 26 via chip select path 46 that receives chip select signal CS2, and so on, up to chip select pad 40 that is electrically coupled to memory die Y at 28 via chip select path 48 that receives chip select signal CSY. The input pads 30 and chip select pads 34, 36, 38, and up to 40 are electrically coupled to one or more external devices that provide input and chip select signals to memory device 20.

Memory device 20 includes data input/output pad 50 that receives and provides data signal DQ0, data input/output pad 52 that receives and provides data signal DQ1, data input/output pad 54 that receives and provides data signal DQ2, and so on, up to data input/output pad 56 that receives and provides data signal DQX. The data input/output pads 50, 52, 54, and up to 56 are electrically coupled to one or more external devices to receive data from or provide data to the external device(s). Each of the memory die 22, 24, 26, and up to 28 includes an input/output pin DQ0 that is electrically coupled to data input/output pad 50 via data path zero at 58 to receive or provide data signal DQ0. Each of the memory die 22, 24, 26, and up to 28 includes an input/output pin DQ1 that is electrically coupled to data input/output pad 52 via data path one at 60 to receive or provide data signal DQ1. Each of the memory die 22, 24, 26, and up to 28 includes an input/output pin DQ2 that is electrically coupled to data input/output pad 54 via data path two at 62 to receive or provide data signal DQ2, and so on, up to each of the memory die 22, 24, 26, and up to 28 including an input/output pin DQX that is electrically coupled to data input/output pad 56 via data path X at 64 to receive or provide data signal DQX.

Each of the memory die 22, 24, 26, and up to 28 includes a compression test mode circuit and other design for test features that compress test result outputs of the individual memory die into an output signal that is provided to one of the output pins DQ0, DQ1, DQ2, and up to DQX. Each of the memory die 22, 24, 26, and up to 28 either defaults or is programmed to provide the output signal to one of the output pads 50, 52, 54, and up to 56 of memory device 20.

In test mode operation, each of the memory die 22, 24, 26, and up to 28 is separately or individually selected and programmed to provide the test result output signal to one of the output pads 50, 52, 54, and up to 56. For example, memory die 0 at 22 is selected via chip select signal CS0 and programmed to provide its test result output signal to output pad 50 in signal DQ0. Next, memory die 1 at 24 is selected via chip select signal CS1 and programmed to provide its test result output signal to output pad 52 in signal DQ1. Next, memory die 2 at 26 is selected via chip select signal CS2 and programmed to provide its test result output signal to output pad 54 in signal DQ2, and so on, up to selecting memory die Y at 28 via chip select signal CSY and programming memory die Y to provide its test result output signal to output pad 56 in signal DQX.

In one embodiment, each of the memory die 22, 24, 26, and up to 28 is similar to each of the other memory die 22, 24, 26, and up to 28 and each of the memory die 22, 24, 26, and up to 28 includes a default output pad setting, such that its test result output signal is provided by default to one of the output pads, such as output pad 50. Thus, one of the memory die does not need to be programmed, but can provide its test result output signal to the default output pad, such as output pad 50. Each of the other memory die 22, 24, 26, and up to 28 is programmed to provide its test result output signal to a different one of the output pads.

Next, all of the memory die 22, 24, 26, and up to 28 are selected at substantially the same time via chip select signals CS0, CS1, CS2, and so on, up to CSY and memory device 20 receives a test command. The test command is received by each of the memory die 22, 24, 26, and up to 28 at substantially the same time. In response to the test command, each of the memory die 22, 24, 26, and up to 28 performs a self test and the compression test mode circuit in the memory die compresses the test results of the memory die into the test result output signal. Next, each of the memory die 22, 24, 26, and up to 28 provides its test result output signal to one of the output pads 50, 52, 54, and up to 56 at substantially the same time. In this example, memory die 0 at 22 provides its test result output signal to output pad 50 in signal DQ0, memory die 1 at 24 provides its test result output signal to output pad 52 in signal DQ1, memory die 2 at 26 provides its test result output signal to output pad 54 in signal DQ2, and so on, up to memory die Y at 28 that provides its test result output signal to output pad 56 in signal DQX. By testing the memory die in parallel and by providing the output signals in parallel, total test time is reduced from the test time of one memory die times the number of memory die in the package to the test time of one memory die.

Figure 2:
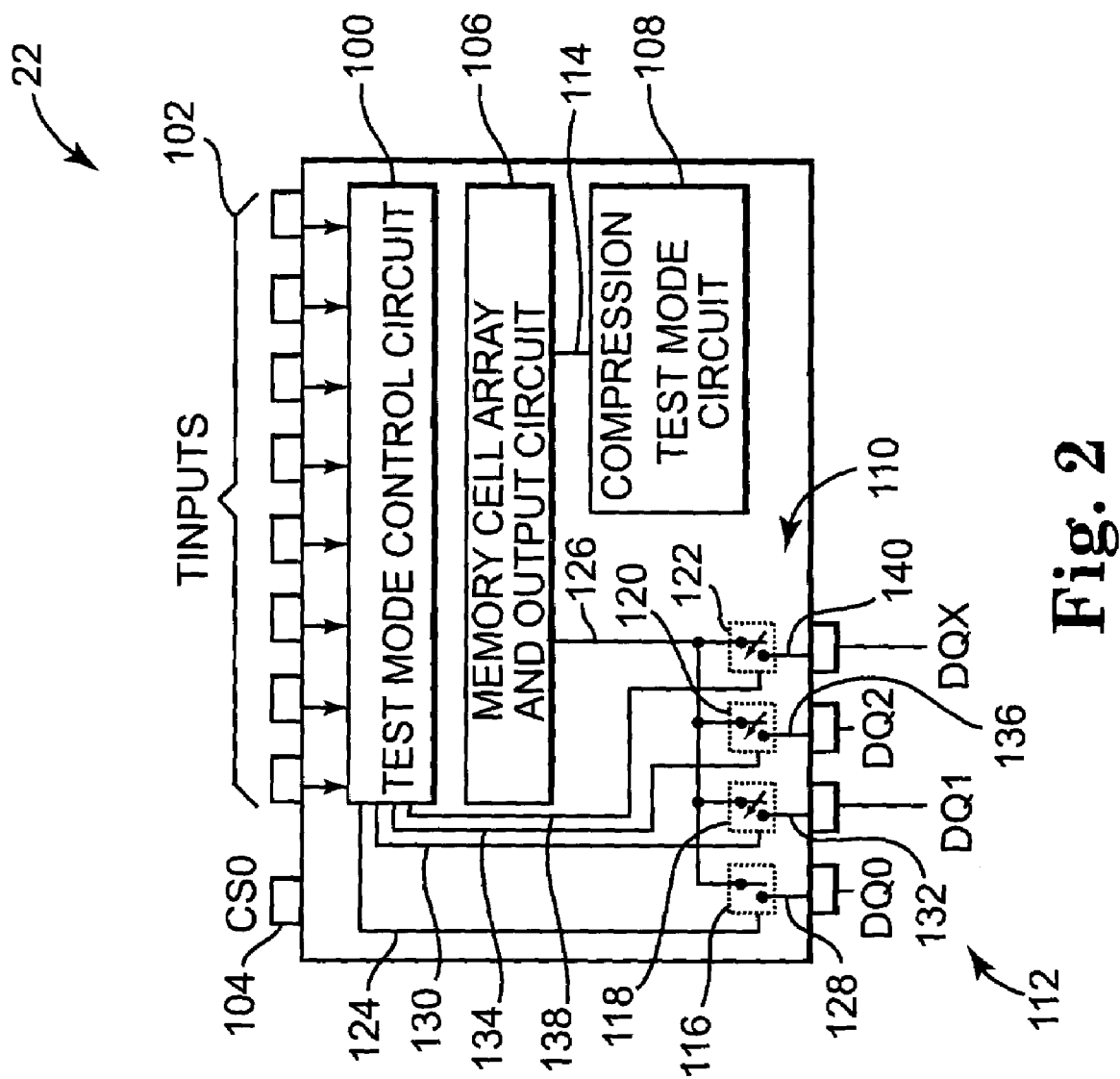
FIG. 2 is a diagram illustrating one embodiment of a memory die.

FIG. 2 is a diagram illustrating one embodiment of memory die 0 at 22. In one embodiment of memory device 20, each of the other memory die 24, 26, and up to 28 is similar to memory die 0 at 22. In other embodiments of memory device 20, each of the memory die 22, 24, 26, and up to 28 is similar to or different from any other die in memory device 20.

Memory die 0 at 22 includes a test mode control circuit 100, input pins 102 that receive test input signals TINPUTS, and a chip select pin 104 that receives chip select signal CS0. The test input signals include test commands and data for test mode operation of memory die 22, 24, 26, and up to 28. Memory die 0 at 22 is selected via chip select signal CS0 and test mode control circuit 100 receives the test input signals to control testing of memory die 0 at 22.

Memory die 0 at 22 also includes a memory cell array and output circuit 106, a compression test mode circuit 108, switch circuitry at 110, and data input/output pins DQ0, DQ1, DQ2, and so on, up to DQX at 112. Memory cell array and output circuit 106 is electrically coupled to compression test mode circuit 108 via test communications path 114. Memory cell array and output circuit 106 includes an array of memory cells, such as one transistor and one capacitor DRAM memory cells, and read and write circuits to read and write memory cells in the array of memory cells. Also, memory cell array and output circuit 106 includes output circuits to provide output signals from memory die 0 at 22. Compression test mode circuit 108 is controlled via test mode control circuit 100 to test memory cells in the array of memory cells and provide compressed test results to the output circuits in memory cell array and output circuit 106. The output circuits provide the compressed test results to switch circuitry 110.

Switch circuitry 110 includes a data zero switch 116, a data one switch 118, a data two switch 120, and so on, up to a data X switch at 122. The control input of data zero switch 116 is electrically coupled to test mode control circuit 100 via data zero control path 124 and one side of the switched path of data zero switch 116 is electrically coupled to memory cell array and output circuit 106 via output signal path 126. The other side of the switched path of data zero switch 116 is electrically coupled to data input/output pin DQ0 at 128. The control input of data one switch 118 is electrically coupled to test mode control circuit 100 via data one control path 130 and one side of the switched path of data one switch 118 is electrically coupled to memory cell array and output circuit 106 via output signal path 126. The other side of the switched path of data one switch 118 is electrically coupled to data input/output pin DQ1 at 132. The control input of data two switch 120 is electrically coupled to test mode control circuit 100 via data two control path 134 and one side of the switched path of data two switch 120 is electrically coupled to memory cell array and output circuit 106 via output signal path 126. The other side of the switched path of data two switch 120 is electrically coupled to data input/output pin DQ2 at 136, and so on, up to the control input of data X switch 122 being electrically coupled to test mode control circuit 100 via data X control path 138 and one side of the switched path of data X switch 122 being electrically coupled to memory cell array and output circuit 106 via output signal path 126. The other side of the switched path of data X switch 122 is electrically coupled to data input/output pin DQX at 140.

Test mode control circuit 100 controls switches 116, 118, 120, and up to 122 via control paths 124, 130, 134, and up to 138, respectively. Test mode control circuit 100 is either programmed to close one of the switches 116, 118, 120, and up to 122 or defaults to closing one of the switches 116, 118, 120, and up to 122, while the other switches remain open. With one of the switches 116, 118, 120, and up to 122 closed, switch circuitry 110 receives the compressed test results via output signal path 126. The closed switch conducts the compressed test results and provides a test result output signal that includes the compressed test results via the corresponding one of the output pins DQ0, DQ1, DQ2, and up to DQX.

In operation, memory die 0 at 22 is configured to provide the test result output signal at any one of the output pins DQ0, DQ1, DQ2, and up to DQX. Memory die 0 at 22 can either be selected and programmed to provide the test result output signal at one of the output pins DQ0, DQ1, DQ2, and up to DQX or memory die 0 at 22 can default to provide the test result output signal at one of the output pins DQ0, DQ1, DQ2, and up to DQX. In one embodiment, memory die 0 at 22 defaults to closing data zero switch 116 and providing the test result output signal at DQ0.

To program memory die 0 at 22 to close one of the switches 116, 118, 120, and up to 122 and provide the test result output signal to one of the output pins DQ0, DQ1, DQ2, and up to DQX, memory die 0 at 22 is selected via chip select signal CS0 and test mode control circuit 100 receives test inputs TINPUTS. The test inputs program test mode control circuit 100 to close a designated one of the switches 116, 118, 120, and up to 122. For example, test mode control circuit 100 is programmed to close data one switch 118 that receives the compressed test results and provides the test result output signal to output pin DQ1.

After the other memory die 24, 26, and up to 28 are either programmed or left at the default setting, all of the memory die 22, 24, 26, and up to 28 are selected at substantially the same time via chip select signals CS0, CS1, CS2, and so on, up to CSY. Next, memory device 20 receives a test command that is received by each of the memory die 22, 24, 26, and up to 28 at substantially the same time. Test mode control circuit 100 receives the test command in memory die 0 at 22.

In response to the test command, test mode control circuit 100 controls the compression test mode circuit 108 and performs a memory test on the array of memory cells in memory cell array and output circuit 106. The compression test mode circuit 108 compresses the test results and provides the compressed test results to the output circuits in memory cell array and output circuit 106, which provide the compressed test results to switch circuitry 110. Test mode control circuit 100 holds one of the switches 116, 118, 120, and up to 122 closed and switch circuitry 110 receives the compressed test results via output signal path 126. The closed switch conducts the compressed test results to provide a test result output signal at the corresponding one of the output pins DQ0, DQ1, DQ2, and up to DQX. For example, if test mode control circuit 100 holds data one switch 118 closed, the data one switch 118 receives the compressed test results and provides the test result output signal at output pin DQ1.

Each of the other memory die 24, 26, and up to 28 in memory device 20 provides its test result output signal to a different one of the output pins DQ0, DQ1, DQ2, and up to DQX at substantially the same time. By testing and providing output signals from all of the memory die 22, 24, 26, and up to 28 in parallel, total test time is reduced from the test time of one memory die times the number of memory die in the package to the test time of one memory die.

Figure 3:
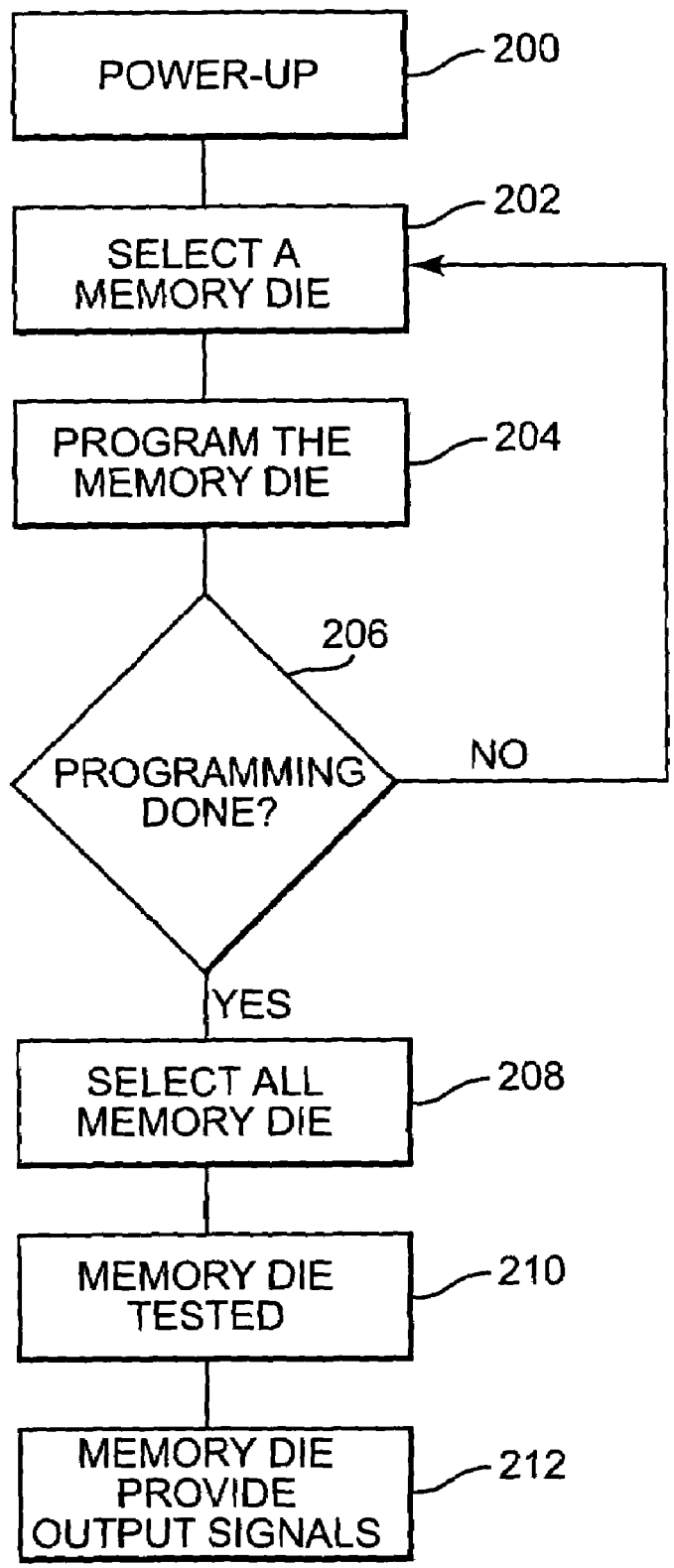
FIG. 3 is a flow chart illustrating test mode operation of one embodiment of a memory device.

FIG. 3 is a flow chart illustrating test mode operation of one embodiment of memory device 20. Memory device 20, including memory die 22, 24, 26, and up to 28, is powered up to be tested at 200. At 202, one of the memory die 22, 24, 26, and up to 28 is selected via one of the chip select signals CS0, CS1, CS2, and up to CSY, while the other memory die are deselected. At 204, the selected one of the memory die 22, 24, 26, and up to 28 is programmed to close one of the switches, such as one of the control switches 116, 118, 120, and up to 122 in memory die 0 at 22, to provide the test result output signal to one of the output pads 50, 52, 54, and up to 56. If another one of the memory die 22, 24, 26, and up to 28 needs to be programmed at 206, the process passes back to selecting another one of the memory die 22, 24, 26, and up to 28 at 202, and the selected one of the memory die 22, 24, 26, and up to 28 is programmed at 204. One of the memory die 22, 24, 26, and up to 28 can be left un-programmed to provide its test result output signal to the default one of the output pins DQ0, DQ1, DQ2, and up to DQX.

For example, memory die 1 at 24 is selected via chip select signal CS1 and programmed to provide its test result output signal to output pad 52 in signal DQ1. Next, memory die 2 at 26 is selected via chip select signal CS2 and programmed to provide its test result output signal to output pad 54 in signal DQ2, and so on, up to selecting memory die Y at 28 via chip select signal CSY and programming memory die Y at 28 to provide its test result output signal to output pad 56 in signal DQX. Memory die 0 at 22 can be left to provide its test result output signal to the default output pad 50 in signal DQ0.

Next, after all of the memory die 22, 24, 26, and up to 28 that need to be programmed have been programmed, all of the memory die 22, 24, 26, and up to 28 are selected at substantially the same time via chip select signals CS0, CS1, CS2, and so on, up to CSY at 208. At 210, memory device 20 and each of the memory die 22, 24, 26, and up to 28 receive a test command at substantially the same time and in response to the test command, each of the memory die 22, 24, 26, and up to 28 performs a memory cell self test and the compression test mode circuit in the memory die compresses the test results of the memory die into compressed test results. At 212, each of the memory die 22, 24, 26, and up to 28 provides its test result output signal to the corresponding one of the output pads 50, 52, 54, and up to 56 at substantially the same time.

In the example, memory die 0 at 22 provides its test result output signal to output pad 50 in signal DQ0, memory die 1 at 24 provides its test result output signal to output pad 52 in signal DQ1, memory die 2 at 26 provides its test result output signal to output pad 54 in signal DQ2, and so on, up to memory die Y at 28 that provides its test result output signal to output pad 56 in signal DQX. By testing all of the memory die 22, 24, 26, and up to 28 in parallel and by providing the output signals in parallel, total test time is reduced from the test time of one memory die times the number of memory die in the package to the test time of one memory die.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory device, comprising:
    at least two output pads; and
    at least two memory die, wherein each of the at least two memory die is configured to provide an output signal that includes compressed test results to a selected one of the at least two output pads such that no two memory die provide the output signal to the same output pad, wherein each of the at least two output pads is selectable via each of the at least two memory die.

2. The memory device of claim 1, wherein one of the at least two memory die provides one output signal to one of the at least two output pads and another of the at least two memory die is programmed to provide another output signal to another of the at least two output pads.

3. The memory device of claim 1, wherein each of the at least two memory die comprises:
    a switch circuit configured to receive the compressed test results; and
    a control circuit configured to control the switch circuit to provide the output signal that includes the compressed test results from the memory die to one of the at least two output pads.

4. The memory device of claim 3, wherein the control circuit in one of the at least two memory die is configured to receive input signals and the control circuit in another of the at least two memory die is configured to receive the input signals.

5. The memory device of claim 1, wherein one of the at least two memory die is configured to receive one chip select signal and another of the at least two memory die is configured to receive another chip select signal to separately select and program the one of the at least two memory die and the other of the at least two memory die.

6. The memory device of claim 1, wherein all of the at least two memory die are selected at substantially the same time and each of the at least two memory die provide the output signal on a different one of the at least two output pads at substantially the same time.

7. A stacked random access memory device, comprising:
    a first output pad;
    a second output pad;
    a first memory die comprising:
        a first switch circuit configured to receive first compressed test results from the first memory die; and
        a first control circuit configured to control the first switch circuit to provide the first compressed test results to one of the first output pad and the second output pad; and
    a second memory die comprising:
        a second switch circuit configured to receive second compressed test results from the second memory die; and
        a second control circuit configured to control the second switch circuit to provide the second compressed test results to one of the first output pad and the second output pad.

8. The stacked random access memory device of claim 7, wherein the first memory die defaults to providing the first compressed test results to the first output pad and the second memory die defaults to providing the second compressed test results to the first output pad.

9. The stacked random access memory device of claim 8, wherein the second memory die is configured to be programmed to provide the second compressed test results to the second output pad.

10. The stacked random access memory device of claim 7, wherein the first memory die is programmed to provide the first compressed test results to the first output pad and the second memory die is programmed to provide the second compressed test results to the second output pad.

11. The stacked random access memory device of claim 7, wherein the first memory die and the second memory die are selected at substantially the same time to test memory cells and the first memory die provides the first compressed test results to one of the first output pad and the second output pad as the second memory die provides the second compressed test results to the other one of the first output pad and the second output pad.

12. A memory device, comprising:
    means for communicating via at least two output paths;
    means for testing a first memory die of at least two memory die to provide a first output signal that includes first compressed test results from the first memory die;
    means for testing a second memory die of the at least two memory die to provide a second output signal that includes second compressed test results from the second memory die; and
    means for switching the first output signal and the second output signal to any of the at least two output paths.

13. The memory device of claim 12, wherein the means for switching the first output signal and the second output signal comprises:
    means for providing the first output signal to one of the at least two output paths by default; and
    means for programming the second memory die to provide the second output signal to another of the at least two output paths.

14. The memory device of claim 12, wherein the means for switching the first output signal and the second output signal comprises:

means for switching the first compressed test results to any of the at least two output paths; and means for controlling the means for switching the first compressed test results.

15. The memory device of claim 12, wherein the means for switching the first output signal and the second output signal comprises:

means for controlling that receives input signals to switch the first compressed test results to one of the at least two output paths; and means for controlling that receives the input signals to switch the second compressed test results to another of the at least two output paths.

16. The memory device of claim 12, comprising:

means for selecting one of the at least two memory die; and means for selecting another of the at least two memory die separately from selecting the one of the at least two memory die.

17. The memory device of claim 12, comprising:

means for selecting all of the at least two memory die at substantially the same time to provide the first output signal and the second output signal on different paths of the at least two output paths at substantially the same time.

18. A method for testing a memory device, comprising providing output signals via at least two output pads that are selectable via each of a first memory die of at least two memory die and a second memory die of the at least two memory die;

testing the first memory die of the at least two memory die to provide a first output signal that includes first compressed test results from the first memory die;

testing the second memory die of the at least two memory die to provide a second output signal that includes second compressed test results from the second memory die;

switching the first output signal to one of the at least two output pads; and switching the second output signal to another one of the at least two output pads such that the first output signal and the second output signal are not provided on the same output pad.

19. The method of claim 18, wherein:

switching the first output signal comprises:

providing the first output signal to one of the at least two output pads by default; and switching the second output signal comprises:

programming the second memory die to provide the second output signal to another of the at least two output pads.

20. The method of claim 18, wherein switching the first output signal comprises:

controlling the switching to provide the first compressed test results to one of the at least two output pads.

21. The method of claim 18, comprising:

selecting one of the at least two memory die; and selecting another of the at least two memory die separately from selecting the one of the at least two memory die.

22. The method of claim 18, comprising:

selecting all of the at least two memory die at substantially the same time to provide the first output signal and the second output signal on different pads of the at least two output pads at substantially the same time.

23. A method of testing a stacked random access memory device, comprising:

providing output signals via first and second output pads that are selectable via each of a first memory die and a second memory die;

receiving first compressed test results from the first memory die at a first switch circuit;

controlling the first switch circuit to provide the first compressed test results to a selected one of the first and second output pads via a first control circuit;

receiving second compressed test results from the second memory die at a second switch circuit; and controlling the second switch circuit to provide the second compressed test results to another selected one of the first and second output pads via a second control circuit, such that the first compressed test results and the second compressed test results are provided on different output pads.

24. The method of claim 23, wherein controlling the first switch circuit comprises defaulting to provide the first compressed test results to the first output pad and controlling the second switch circuit comprises programming the second memory die to provide the second compressed test results to the second output pad.

25. The method of claim 23, comprising:

selecting the first memory die and the second memory die at substantially the same time to test memory cells;

outputting the first compressed test results to the selected one of the first and second output pads; and outputting the second compressed test results to the other selected one of the first and second output pads at substantially the same time that the first compressed test results are output to the selected one of the first and second output pads.

* * * * *